United States Patent
Copel et al.

(10) Patent No.: US 8,735,243 B2
(45) Date of Patent: May 27, 2014

(54) FET DEVICE WITH STABILIZED THRESHOLD MODIFYING MATERIAL

(75) Inventors: Matthew W. Copel, Yorktown Heights, NY (US); Bruce B. Doris, Brewster, NY (US); Vijay Narayanan, New York, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 11/834,641

(22) Filed: Aug. 6, 2007

(65) Prior Publication Data

US 2009/0039447 A1     Feb. 12, 2009

(51) Int. Cl.
*H01L 21/8238* (2006.01)
*H01L 21/335* (2006.01)
*H01L 21/336* (2006.01)
*H01L 21/8234* (2006.01)
*H01L 29/51* (2006.01)
*H01L 21/28* (2006.01)

(52) U.S. Cl.
CPC .......... *H01L 29/513* (2013.01); *H01L 29/517* (2013.01); *H01L 21/823857* (2013.01); *H01L 21/28229* (2013.01)
USPC .......... 438/216; 257/213; 257/288; 257/295; 257/296; 257/310; 438/142; 438/197; 438/238; 438/239; 438/240

(58) Field of Classification Search
CPC .......... H01I 29/43; H01I 29/49; H01I 29/51; H01I 29/511; H01I 29/513; H01I 29/517; H01I 21/28194; H01I 21/28229; H01I 21/3162; H01I 21/31645; H01I 21/02172; H01I 21/02178; H01I 21/02181; H01I 21/022; H01I 21/823857
See application file for complete search history.

(56) References Cited

U.S. PATENT DOCUMENTS 6,682,973 B1 *   1/2004   Paton et al. ............... 438/240
2002/0153579 A1 * 10/2002   Yamamoto .................. 257/412

(Continued)

FOREIGN PATENT DOCUMENTS

CN   1656596 A   8/2005

OTHER PUBLICATIONS

Jamison et al., "A Comparison of Electrical and Physical Properties of MOCVD Hafnium Silicate Thin Films Deposited using Various Silicon Precursors.", 2006, Materials Research Society, Mater. Res. Soc. Symp. Proc. vol. 17, 0917-E07-03.*
Definition of recrystallization: http://www.merriam-webster.com/dictionary/recrystallize.*

(Continued)

*Primary Examiner* — Amar Movva
*Assistant Examiner* — Cory Eskridge
(74) *Attorney, Agent, or Firm* — Cantor Colburn LLP; Vazken Alexanian

(57) ABSTRACT

A method for fabricating an FET device is disclosed. The FET device has a gate insulator with a high-k dielectric portion, and a threshold modifying material. The method introduces a stabilizing material into the gate insulator in order to hinder one or more metals from the threshold modifying material to penetrate across the high-k portion of the gate insulator. The introduction of the stabilizing material may involve disposing a stabilizing agent over a layer which contains an oxide of the one or more metals. A stabilizing material may also be incorporated into the high-k dielectric. Application of the method may lead to FET devices with unique gate insulator structures.

6 Claims, 5 Drawing Sheets

(56) References Cited

U.S. PATENT DOCUMENTS

| | | | |
|---|---|---|---|
| 2004/0135217 A1* | 7/2004 | Yamamoto | 257/410 |
| 2005/0056900 A1* | 3/2005 | Wang et al. | 257/410 |
| 2005/0233526 A1* | 10/2005 | Watanabe et al. | 438/287 |
| 2006/0211259 A1* | 9/2006 | Maes et al. | 438/762 |
| 2006/0286747 A1* | 12/2006 | Mouli et al. | 438/257 |
| 2007/0032008 A1 | 2/2007 | Kim et al. | 438/199 |
| 2007/0096104 A1* | 5/2007 | Tatsumi et al. | 257/66 |
| 2007/0148838 A1* | 6/2007 | Doris et al. | 438/197 |
| 2007/0152276 A1 | 7/2007 | Arnold | 257/369 |
| 2008/0237694 A1* | 10/2008 | Specht et al. | 257/324 |
| 2008/0251836 A1* | 10/2008 | Park | 257/324 |

OTHER PUBLICATIONS

"Examination of flatband and threshold voltage tuning of $HfO_2$/TiN field effect transistors by dielectric cap layers" Guha et al., Appl. Phys. Lett. 90, 092902 (2007).

"A Comparison of Electrical and Physical Properties of MOCVD Hafnium Silicate Thin Films Deposited using Various Silicon Precursors" P. Jamison, et al., Materials Research Society Symposium Proceedings 917E, 0917-E07-03 (2006).

V. Narayanan, et al., "Band-Edge High-Performance High-/Metal Gate n-MOSFETs using Cap Layers Containing Group IIA and IIIB Elements with Gate-First Processing for 45 nm and Beyond", Symp. VLSI Tech. (2006) 224-225.

* cited by examiner

FET DEVICE WITH STABILIZED THRESHOLD MODIFYING MATERIAL

FIELD OF THE INVENTION

The present invention relates to electronic devices. In particular, it relates to FET devices having high-k dielectric containing gate insulators, and metal containing gates.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials, or alloys. Such a Si alloy may be, for instance, silicon-germanium (SiGe). The devices in the embodiments of the present disclosure are typically part of the art of single crystal, Si based material device technology.

There is a great difficulty in maintaining performance improvements in devices of deeply submicron generations. Therefore, methods for improving performance without scaling down have become of interest. There is a promising avenue toward higher gate dielectric capacitance without having to make the gate dielectric actually thinner. This approach involves the use of so called high-k materials. The dielectric constant of such materials is significantly higher than that of $SiO_2$, which is about 3.9. A high-k material may physically be thicker than oxide, and still have a lower equivalent oxide thickness (EOT) value. The EOT, a concept known in the art, refers to the thickness of such an $SiO_2$ layer which has the same capacitance per unit area as the insulator layer in question. In today state of the art FET devices, one is aiming at an EOT of below 2 nm, and preferably below 1 nm.

Device performance is also enhanced by the use of metal gates. The depletion region in the traditional poly-Si next to the gate insulator may become an obstacle in increasing gate-to-channel capacitance. The solution is to use a metal gate. Metal gates also assure good conductivity along the width direction of the devices, reducing the danger of possible RC delays in the gate.

High performance small FET devices are in need of precise threshold voltage control. As operating voltage decreases, to 2V and lower, threshold voltages also have to decrease, and threshold variation becomes less tolerable. Every new element, such as a different gate dielectric, or a different gate material, influences the threshold voltage.

Specific layers of threshold modifying materials, so called cap layers, have been introduced into FET gate insulators for the purpose of favorably adjusting the apparent workfunction of the gate. The introduction of cap layers, in turn, may lead to complications with device performance in the form of possibly decreased channel mobility of the charge carriers.

SUMMARY OF THE INVENTION

In view of the discussed difficulties, embodiments of the present invention disclose a method for producing a field effect transistor (FET), which FET has a gate insulator with a high-k dielectric portion. The method introduces a stabilizing material into the gate insulator in order to hinder one or more metals from penetrating across the high-k portion of the gate insulator. The introduction of the stabilizing material may involve disposing a stabilizing agent over, and is direct contact with a threshold modifying layer which contains an oxide of the one or more metals.

Embodiments of the present invention further disclose a layered structure which includes a stabilizing agent layer, and which layered structure is instrumental in fabricating a FET gate insulator.

Embodiments of the present invention further disclose a FET in which the gate insulator has a high-k portion. This high-k portion contains Si in a concentration of between about 1% and about 10%. The gate insulator further contains one or more metals from the group of La, Mg, Y, Al, Ba, Sr, Sc, and of their combinations.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
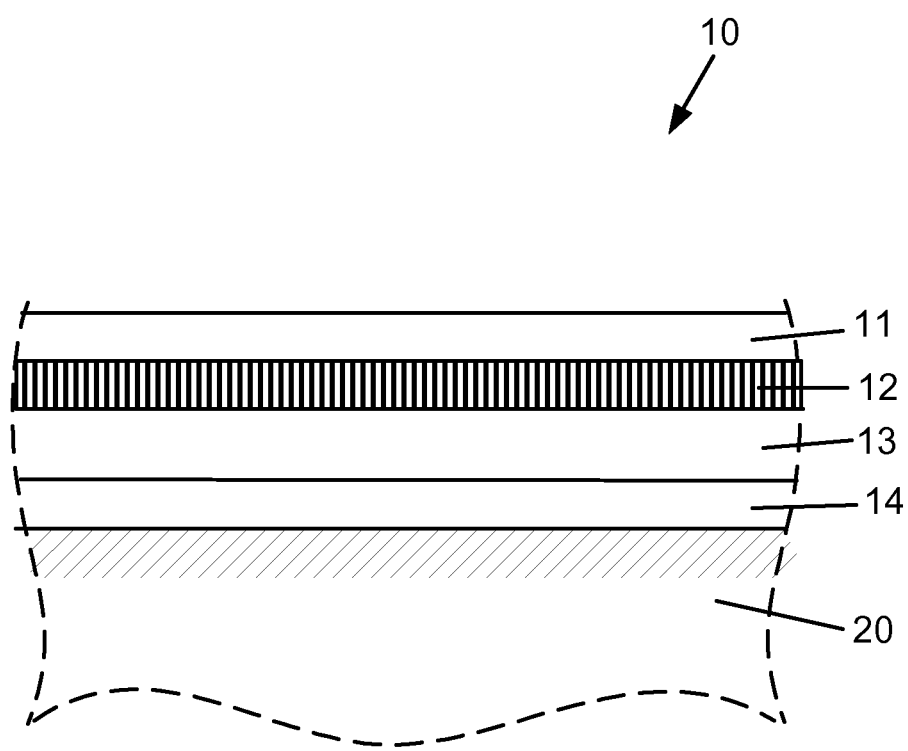
FIG. 1 shows a layered structure having a cap layer and a layer of a stabilizing agent.

It is understood that Field Effect Transistor-s (FET) are well known in the electronic arts. Standard components of a FET are the source, the drain, the body in-between the source and the drain, and the gate. The body is usually part of a substrate, and it is often called substrate. The gate is overlaying the body and is capable to induce a conducting channel in the body between the source and the drain. In the usual nomenclature, the channel is hosted by the body. The gate is separated from the body by the gate insulator, or dielectric. There are two type of FET devices: a hole conduction type, called PFET, and an electron conduction type, called NFET. Often, but not exclusively, PFET and NFET devices are wired into CMOS circuits.

In FET operation an inherent electrical attribute is the threshold voltage. When the voltage between the source and the gate exceeds the threshold voltage, the FETs are capable to carry current between the source and the drain. Since the threshold is a voltage difference between the source and the gate of the device, in general NFET threshold voltages are positive values, and PFET threshold voltages are negative values. Typically, two threshold voltages are considered in the electronic art: the low voltage threshold, and the saturation threshold. The saturation threshold, which is the threshold voltage when a high voltage is applied between the source and the drain, is lower than the low voltage threshold.

As FET devices are scaled to smaller size, the traditional way of setting threshold voltage, namely by adjusting body and channel doping, loses effectiveness. The effective workfunction of the gate material, and the gate insulator properties are becoming important factors in determining the thresholds of small FETs. Such so called small FETs have typically gate, or gate stack, lengths of less than 50 nm, and operate in the range of less than about 1.5 V. The gate stack, or gate, length is defined in the direction of the device current flow, between the source and the drain. For small FETs the technology is progressing toward the use of metallic gates and of high-k dielectrics for gate insulators.

In small devices with low EOT gate insulators, the workfunction of the gate may significantly influence the threshold voltage. In the general terminology of the art, one characterizes the workfunction of the gate in relation to the Si energy gap. For instance, in the art the term "band-edge workfunction" means that the gate has a workfunction like that of $n^+$, or $p^+$ Si. Similarly, "mid-gap", or "quarter-gap" workfunction mean a gate appearing to have a workfunction roughly like intrinsic silicon, or one halfway between intrinsic Si and heavily doped Si. All other things being equal, with only the gate workfunction changing, the threshold difference for a small device is about 0.5 V for a gate workfunction going from band-edge value to mid-gap value.

When a metal gate, such as for instance TiN, is used in conjunction with a high-k gate dielectric, such as for instance $HfO_2$, often the threshold corresponds to an effective work function that is not too far from mid-gap. Such a threshold value may not be optimal, and further threshold adjusting schemes may have to be introduced.

It was studied and observed that sandwiching a layer of a threshold modifying material, a so called cap layer between the high-k material of the gate insulator and the gate metal, such as between a $HfO_2$ dielectric and a TiN electrode, and using appropriate processing treatments, the effective workfunction of the gate can be shifted toward a Si band-edge value. Such cap layers may typically be metal-oxide compounds. In representative embodiments of the invention such metal-oxide cap layers may be $La_2O_3$, MgO, and several other oxides. The effect of such cap layers has been already reported in the art, for instance by V. Narayanan et al. in "IEEE VLSI Symposium", p. 224, (2006), and by Guha et al. in Appl. Phys. Lett. 90, 092902 (2007).

Generally, the gate dielectric in the technology characterized as "high-k" is fabricated in several, usually very thin, layers. In such FET processing technologies one is often dealing with layer thicknesses even below 1 nm. In thin layers due to interfacial effects, and possible intermixing between various layers, the composition of any given layer may not match exactly their supposed bulk composition. Therefore, to indicate the possibility of such thin layer effects, often the symbol "x" is used in chemical formulas giving the composition of very thin layers, for instance $SiO_x$. It is understood that the "x" in $SiO_x$, for instance, is close to, but not necessarily equal to 2.

The introduction of the metal-oxide cap layers may lead to mobility degradation in a FET device channel. Typically the layer actually covering and in contact with the Si channel may be oxide, $SiO_x$, usually between about 0.2 nm and about 1.0 nm thick. Its role may be to provide a smooth interface to the underlying Si, promoting high carrier mobility in the channel. In representative embodiment of the present invention the high-k portion of the gate insulator overlays this interfacial oxide layer. Typically, the threshold modifying cap layer, containing a metal oxide, covers the high-k layer. Mobility degradation may occur due to the metal of the cap layer penetrating across the high-k portion, and reaching the interfacial oxide layer. The metal from the cap layer, which typically might be La, Mg, Y, Al, Ba, Sr, Sc, and their combination thereof, upon reaching the oxide layer may form a silicate. A silicate compound is one of any combination of silicon, oxygen, and a metal, for instance, such as a La silicate. The silicate compound at, or within a few 0.1 nm-s, of the FET channel, may cause additional carrier scattering, with the result of a decreased carrier mobility.

The movement of the metal from the cap layer may be concomitant with a movement of the Si from the interfacial oxide layer toward the cap layer. The Si is penetrating across the high-k portion, as well. Such movement, or intermixing of elements across the high-k layer may be facilitated by high temperature processing steps. In FET processing typically the largest temperature budgets, meaning temperature and time exposure combinations, are reached during the source/drain electrode fabrication. In a desired processing sequence the gate insulator and the gate are already in place when the source/drain electrodes are being fabricated. Accordingly, when questions of intermixing of elements in the gate insulator are addressed, it may be assumed that the gate insulator will be exposed to such temperature budgets as may be needed for source/drain activation. Such exposures in representative embodiments of the invention may be approximately 1000° C. for a few seconds, maybe from 3 sec to 10 sec.

In order to address the undesired effects of intermixing of compounds in the gate insulator during an elevated temperature cycle, a stabilizing material may be introduced into the gate insulator. Such a stabilizing material may hinder the metal from penetrating across the high-k portion. The same stabilizing material may also be hindering the Si from the oxide layer on the Si surface, the so called interfacial oxide layer, to penetrate across the high-k portion in the opposite direction, into the metal oxide cap layer. Thermodynamic considerations indicate that a stabilizing material hindering one species, for instance Si, may hinder the crossing of other elements, such as metals, as well.

It may be the case that the metal and the Si penetrate across the high-k portion of the gate insulator along the grain boundaries of the high-k material. Plugging up, or saturating available sites with a stabilizing material species along grain boundaries of the high-k material may hinder further species to pass along the same grain boundaries.

Depending on what material can be found in the cap layer, and what may be the composition of the high-k material, embodiments of the present invention may apply Si, or Al, or their combination thereof as stabilizing materials.

In addition to the presented grain boundary saturation, or as an alternative to it, it may also be possible to change the preferred direction of the displacement of the metal of the cap layer. This may be accomplished by providing a target for silicate formation which may be nearer to the cap layer than the interfacial oxide is. Such a method may be used in some embodiments of the present invention by disposing a stabilizing agent directly over the cap layer. The stabilizing agent may be a compound which contains the stabilizing material species. FIG. 1 schematically depicts such an arrangement.

FIG. 1 shows a layered structure 10 having a threshold modifying cap layer 12 and a layer of a stabilizing agent 11. Such a layered structure, fabricated before the source/drain activation thermal cycle, can serve as an improved gate dielectric. Even after encountering an intensive thermal cycle, the layered structure 10 may serve in high performance small FET devices for dielectric. The gate insulator, which was fabricated as the layer structure of FIG. 1, would have the desired low EOT due to the high-k portion 13, would have band edge workfunction due to the cap layer 12. The FET having such a gate dielectric would have high mobility, since metal would be hindered from penetrating across the high-k portion 13 to reach the interfacial oxide layer 14.

In representative embodiments of the present invention the layered structure 10 of FIG. 1 contains at least such materials and layers as follows. A Si based material substrate 20, which typically is essentially pure Si. The FET device body is usually part of this substrate 20. The FET channel is hosted by the device body. A silicon oxide layer 14 between about 0.2 nm and about 1.0 nm thick, is disposed onto the Si based substrate 20. The composition of this oxide layer 14, as discussed earlier, is $SiO_x$, with "x" being approximately 2. This oxide layer 14, also referred to as an interfacial oxide layer, is typically deposited by chemical means, as known in the art. A high-k dielectric layer 13 is disposed over, and it is in direct contact with the interfacial oxide layer 14. The high-k dielectric layer 13 may contain any of the materials known in the art, including, but not limited to oxides of Zr, Hf, Al, HfSi, HfSiN, and their combination thereof. The thickness of high-k dielectric layer 13 may be between about 1.0 nm and about 2.5 nm. A cap layer 12, which may be introduced for threshold adjusting purposes, is disposed over, and it is in direct contact with the high-k dielectric layer 13. The thickness of the cap layer 12 in representative embodiments of the invention may be between about 0.2 nm and 0.7 nm. The material of the cap layer 12 may include, again without limiting other possibilities, oxides of such threshold modifying metals as La, Mg, Y, Al, Ba, Sr, Sc, and their combination thereof. In typical embodiments of the invention the cap layer may be $LaO_x$, with the understanding that the bulk chemical composition of this material would be $La_2O_3$. A stabilizing layer 11, or in equivalent terminology a layer of a stabilizing agent 11, is disposed over, and it is in direct contact with the cap layer 12. This stabilizing agent layer 11 may be between about 0.1 nm and about 0.5 nm thick. The stabilizing agent layer 11 may be of silicon oxide ($SiO_x$, with "x" being approximately 2), silicon nitride, silicon oxinitride, aluminum oxide, aluminum nitride, and their combination thereof. These stabilizing agents contain, and serve as the source for the stabilizing materials such as Si, Al, and their combinations.

FIG. 1 does not show the physical extent of an actual gate dielectric, as indicated by the wavy dashed line boundaries. It only shows a schematic of the layered composition in cross section. Typically the next layer above the stabilizing layer 11 would be a gate metal, such as, for instance TiN, W, Ta, or any other known in the art.

Figure 2:
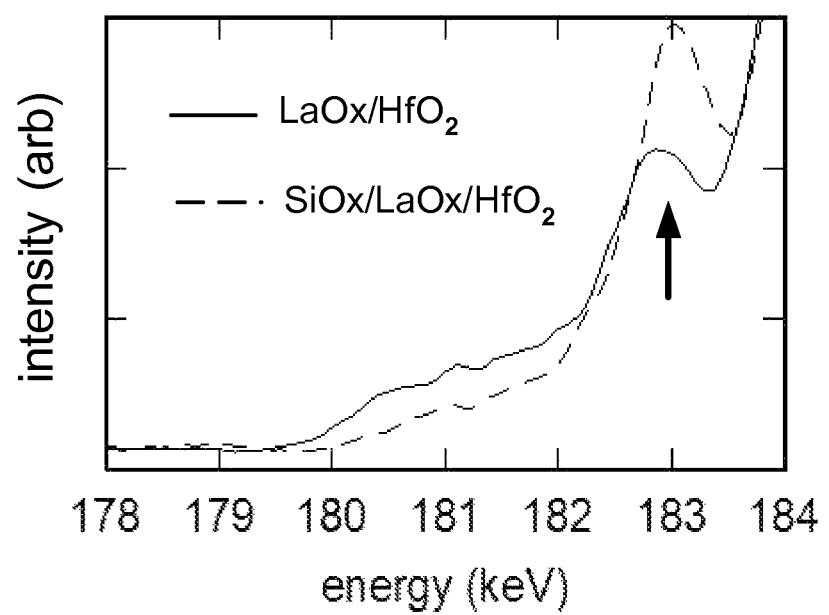
FIG. 2 shows medium energy ion scattering (MEIS) results on un-stabilized and stabilized layered structures.

Experiments demonstrate the effectiveness of applying a stabilizing agent layer next to a cap layer for hindering the metal from penetrating across the high-k layer. FIG. 2 shows medium energy ion scattering (MEIS) results on un-stabilized and stabilized layered structures. As it is well known in the art, MEIS is a standard technique for depth profiling of various elements. In FIG. 2 the intensity on the vertical scale is proportional to the La concentration, and the energy on the horizontal axis translates into distance. The thick vertical upward pointing arrow shows the location of the "as deposited" $LaO_x$. The solid line in the figure gives the MEIS spectrum for an un-stabilized $LaO_x/HfO_2$ layered structure, and the dashed line shows an identical MEIS spectrum with stabilization. The stabilized layered structure is $SiO_x/LaO_x/HfO_2$, with the $SiO_x$ being the stabilizing agent containing the Si stabilizing material. Both the un-stabilized and the stabilized layers have been exposed to the same thermal cycle of 5 sec on 1000° C. The MEIS spectra clearly show that in the stabilized layered structure a much larger portion of the La stays where it was originally deposited (over the vertical arrow). The Si stabilizing material hinders the La from penetrating into the high-k layer. (The upturn for both curves at higher energy may be due to the Hf in the high-k layer.)

Figure 3:
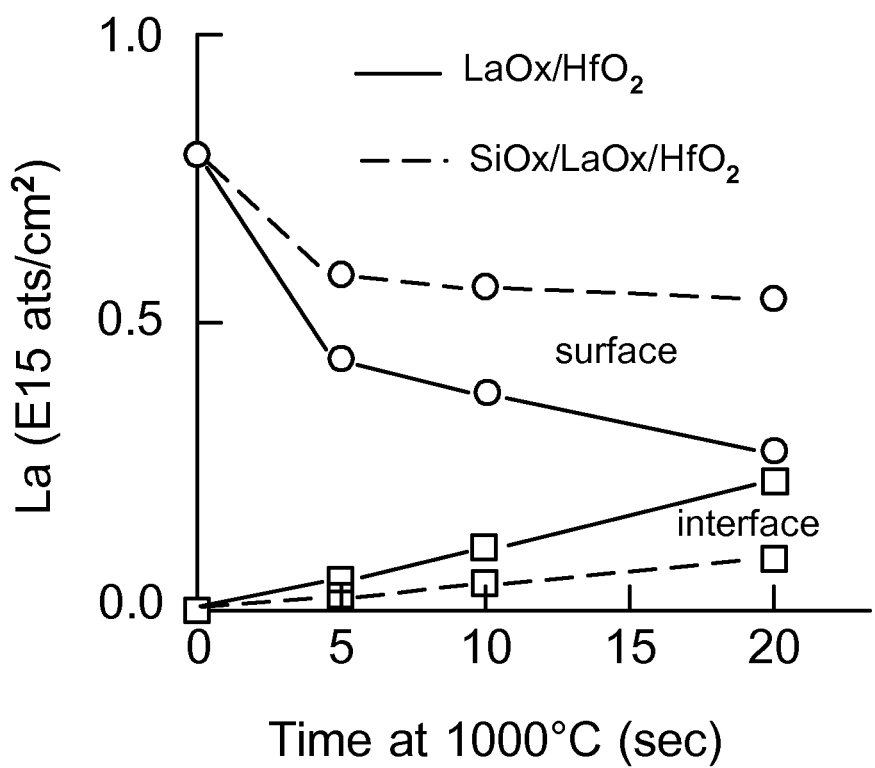
FIG. 3 shows effects of stabilization on layered structures for gate dielectrics.

FIG. 3 shows effects of stabilization on layered structures for gate dielectrics in a summary form. Again, the solid line represents the un-stabilized layered structure and the dashed line the stabilized layered structure. The horizontal axis gives the thermal budget that the structures received, while the vertical axis gives the La area concentration in units of $10E15/cm^2$ at two positions, at the surface, and at the $LaO_x/HfO_2$ interface. The less the La is capable to penetrate into the high-k $HfO_2$, the more of the La stays on the surface, and less of it is found at the interface. FIG. 3 shows that the $SiO_x$ stabilizing agent layer decreases the La concentration at the interface by over a factor of two.

In further representative embodiments of the invention, which are aiming for grain boundary saturation in the high-k material, a stabilizing material may be introduced directly into the high-k portion of the gate dielectric. One may co-deposit Si with $HfO_x$ to a concentration of between about 1% and about 5%, but typically not above 10%. Such co-disposition of Si with $HfO_x$ has been already demonstrated, for instance in "A Comparison of Electrical and Physical Properties of MOCVD Hafnium Silicate Thin Films Deposited using Various Silicon Precursors" P. Jamison, et al. Materials Research Society Symposium Proceedings 917E, 0917-E07-03 (2006). After the co-disposition of $HfO_x$ and Si, the high temperature annealing would form crystalline $HfO_x$. The Si may stay in the grain boundaries, possibly forming Si—O bonding. Since most of the Si may stay in the grain boundaries, it might not affect the dielectric constant of the high-k material, and at the same time it would hinder an additional species, such as a metal, from penetrating across the high-k layer.

In further embodiments of the invention, the Si stabilizing material may be introduced into the high-k dielectric by exposing the high-k portion of the gate insulator to silane ($SiH_4$) for short periods, such as between about 1 min and 5 min at a temperature approximately between about 400° C. and about 500° C. After a high temperature cycle, the silane exposed high-k material, for instance HfOx, would behave similarly to one where co-disposition occurred.

Figure 4:
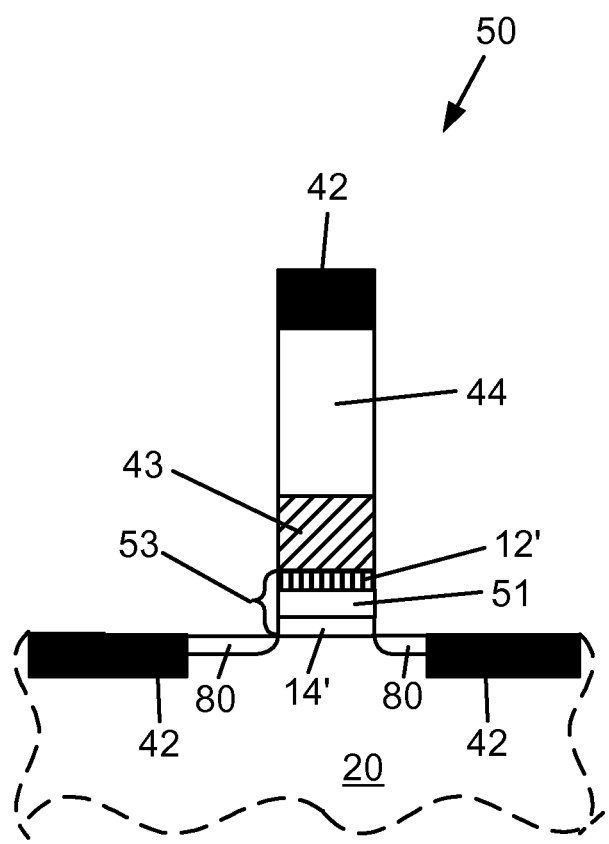
FIG. 4 shows a schematic cross section of an FET device as an embodiment of the invention.

By using directly introduced Si stabilization on the high-k portion of the gate dielectric, one may arrive at a FET device 50 as schematically shown in FIG. 4. It is understood that FIG. 4, as all figures, is only a schematic representation. As known in the art, there may be many more, or less, elements in the structures than presented in the figures, but these would not affect the scope of the embodiments of the present invention. It is also understood that in addition to the elements of the embodiments of the invention, the figure may show several other elements since they are standard components of FET devices.

In FIG. 4 the gate dielectric 53 is composed of three layers: an interfacial oxide layer 14', a cap layer 12', and a high-k portion 51. The primed indicator numbers are intended to refer to similarities with the layers in FIG. 1. It is quite possible that the corresponding layers in FIG. 1, the interfacial oxide layer 14, and the cap layer 12 are almost the same as the alike named layers in the device 50 of FIG. 4. However, they probably are not exactly identical in composition since between the state of the layered structure of FIG. 1, and the state of the fully formed FET device 50 of FIG. 4, there are a large number of processing steps to be performed, including heat cycles, and many of these might influence composition. Accordingly, these in principle same layers might exhibit some differences, hence the priming of the corresponding indicator numbers.

The high-k portion 51 of the gate insulator 53 contains a Si concentration of between about 1% and about 10%, preferably of between about 1% and about 5%. This Si concentration has been introduced into the high-k portion, which high-k portion may be $HfO_2$, (or HfOx), or in general any other high-k material known in the art, in either a co-disposed manner, or by silane exposure, as discussed earlier.

The FET device 50 has a Si based material body 20, source/drain 80, and silicided terminals 42. As one skilled in the art would know, these elements all have their individual characteristics. Accordingly, when common indicator numbers are used in the figure it is because from the point of view of embodiments of the present invention the individual characteristics of such elements are not important. The gate dielectric 53, which in a general case may contain additional layers besides the three 14', 51, 12', indicated in the figure, is contacted by a gate stack. The gate stack, again without limiting other possibilities known in the art, may contain a metal portion 43, and a Si portion 44. In the embodiments of the present invention the metal portion of the gate stack 43, for instance TiN, is directly contacting the gate dielectric, or insulator, 53.

Figure 5:
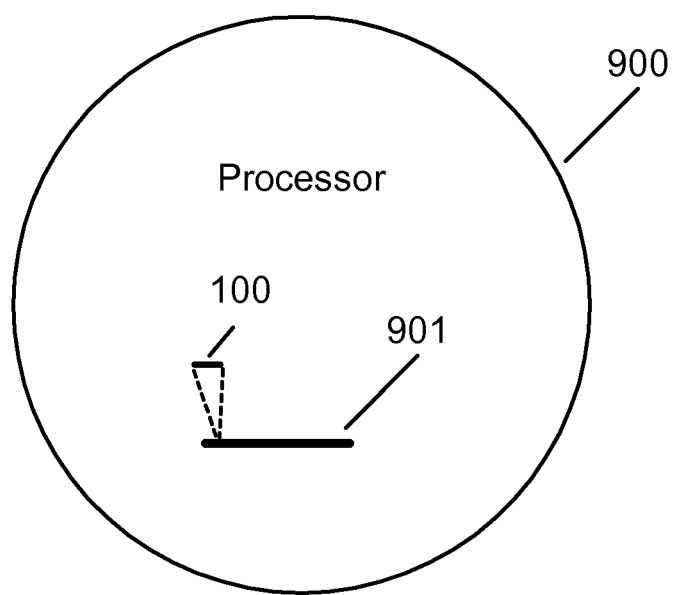
FIG. 5 shows a symbolic view of a processor containing at least one FET device having a stabilized high-k dielectric gate insulator.

FIG. 5 shows a symbolic view of a processor containing at least one FET device according to an embodiment of the present invention, or an FET device fabricated according to the disclosed methods. Such a processor 900 has at least one chip 901, which contains at least one circuit structure 100 having at least one FET device with stabilized gate dielectrics and near band edge gate workfunctions. The processor 900 may be any processor which can benefit from embodiments of the present invention, which yields high performance due to improved carrier mobility. Representative embodiments of processors manufactured with embodiments of the disclosed method and structure may be digital processors, typically found in the central processing complex of computers; mixed digital/analog processors, typically found in communication equipment; and others.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method of forming a field effect transistor (FET) with a crystalline high-k dielectric, the method comprising:
   forming an interfacial oxide layer over a substrate;
   forming a crystalline high-k dielectric layer over the interfacial oxide layer, the crystalline high-k dielectric layer including a silicon stabilizing material therein configured to hinder one or more metals from penetrating across the crystalline high-k dielectric layer, the silicon stabilizing material introduced into the crystalline high-k dielectric layer by co-disposing silicon together with the crystalline high-k dielectric layer, wherein a concentration of silicon in the crystalline high-k dielectric layer is selected to be about 1%;
   forming a metal oxide cap layer on the crystalline high-k dielectric layer;
   forming a silicon oxide stabilizing agent layer on the metal oxide cap layer, the stabilizing agent layer having a thickness between about 0.1 nanometers (nm) and 0.5 nanometers thick, and the metal oxide cap layer having a thickness between about 0.2 nm and 0.7 nm;
   forming an electrically conductive metal gate electrode portion on the stabilizing agent layer; and
   forming a silicon gate electrode portion on the electrically conductive metal gate electrode portion, thereby forming the FET with the crystalline high-k dielectric.

2. The method of claim 1, wherein the silicon stabilizing material of the crystalline high-k dielectric layer hinders silicon from penetrating across the high-k dielectric layer.

3. The method of claim 1, wherein the metal oxide cap layer includes one or more metals selected from the group consisting of Mg, Y, Al, Ba, Sr, Sc, and combinations thereof.

4. The method of claim 1, wherein the high-k dielectric layer is selected from oxides of the group consisting of Zr, Hf, Al, HfSi, HfSiN, and combinations thereof.

5. The method of claim 1, further comprising introducing the silicon stabilizing material into the crystalline high-k dielectric layer by:
   upon completion of forming the high-k dielectric layer, exposing the crystalline high-k dielectric layer to $SiH_4$ gas at a temperature between about 400° C. and about 500° C., for a duration of about 1 minute to about 5 minutes.

6. A field effect transistor (FET), comprising:
   a substrate;
   an interfacial oxide layer disposed on the substrate;
   a crystalline high-k dielectric layer disposed over the interfacial oxide layer, the crystalline high-k dielectric layer including a silicon stabilizing material therein configured to hinder one or more metals from penetrating across the crystalline high-k dielectric layer, wherein the crystalline high-k dielectric layer has a silicon concentration of about 1%;
   a metal oxide cap layer disposed on the crystalline high-k dielectric layer, the metal oxide cap layer including one or more metals selected from the group consisting of Mg, Y, Al, Ba, Sr, Sc, and combinations thereof;
   a silicon oxide stabilizing agent layer disposed on the metal oxide cap layer, the stabilizing agent layer having a thickness between about 0.1 nanometers (nm) and 0.5 nanometers thick, and the metal oxide cap layer having a thickness between about 0.2 nm and 0.7 nm;
   an electrically conductive metal gate electrode portion disposed on the stabilizing agent layer; and
   a silicon gate electrode portion formed on the electrically conductive metal gate electrode portion, thereby defining the FET with the crystalline high-k dielectric layer.

* * * * *